(12) United States Patent
Hum

(10) Patent No.: US 8,395,312 B2
(45) Date of Patent: Mar. 12, 2013

(54) PHOSPHOR CONVERTED LIGHT SOURCE HAVING AN ADDITIONAL LED TO PROVIDE LONG WAVELENGTH LIGHT

(75) Inventor: David Hum, San Bruno, CA (US)

(73) Assignee: Bridgelux, Inc., Livermore, CA (US)

( * ) Notice: Subject to any disclaimer, the term of this patent is extended or adjusted under 35 U.S.C. 154(b) by 105 days.

(21) Appl. No.: 12/762,943

(22) Filed: Apr. 19, 2010

(65) Prior Publication Data

US 2011/0068697 A1    Mar. 24, 2011

(51) Int. Cl.
*H05B 37/02* (2006.01)
*H01L 33/00* (2010.01)
*H01L 33/48* (2010.01)
*H01L 33/50* (2010.01)

(52) U.S. Cl. .......... 313/501; 313/500; 313/507; 445/24; 445/25; 315/169.1; 315/169.3

(58) Field of Classification Search ........... 313/498–512
See application file for complete search history.

(56) References Cited

U.S. PATENT DOCUMENTS

| | | | |
|---|---|---|---|
| 5,998,925 A | 12/1999 | Shimizu et al. | 313/503 |
| 6,600,175 B1 | 7/2003 | Baretz et al. | 257/100 |
| 7,022,994 B2 * | 4/2006 | Fuchs et al. | 250/361 R |
| 7,026,756 B2 | 4/2006 | Shimizu et al. | 313/503 |
| 7,078,732 B1 | 7/2006 | Reeh et al. | 257/98 |
| 7,151,283 B2 | 12/2006 | Reeh et al. | 257/98 |
| 7,531,960 B2 | 5/2009 | Shimizu et al. | 313/512 |
| 2002/0056811 A1 * | 5/2002 | Otto | 250/370.11 |
| 2005/0134197 A1 * | 6/2005 | Lee et al. | 315/291 |
| 2007/0069643 A1 * | 3/2007 | Brunner et al. | 313/512 |
| 2009/0296770 A1 * | 12/2009 | Kinugasa et al. | 374/1 |

* cited by examiner

*Primary Examiner* — Tracie Y Green

(57) ABSTRACT

A light source having first and second LEDs and a phosphor layer that converts light generated by the first LED is disclosed. The first LED emits light at a first wavelength. The layer of phosphor is illuminated by the first LED, the phosphor being excited by light of the first wavelength to convert light of the first wavelength to a band of wavelengths having wavelengths between the first wavelength and a second wavelength. The second LED emits light at a third wavelength that is greater than the first wavelength. The phosphor is not substantially excited by light of the third wavelength. The combined light from the phosphor, and first and second LEDs is perceived as being white by a human observer.

16 Claims, 4 Drawing Sheets

PHOSPHOR CONVERTED LIGHT SOURCE HAVING AN ADDITIONAL LED TO PROVIDE LONG WAVELENGTH LIGHT

BACKGROUND OF THE INVENTION

Light emitting diodes (LEDs) are attractive candidates for replacing conventional light sources such as incandescent lamps and fluorescent light sources. LEDs have substantially higher light conversion efficiencies than incandescent lamps and longer lifetimes than both types of conventional light sources. In addition, some types of LEDs now have higher conversion efficiencies than fluorescent light sources and still higher conversion efficiencies have been demonstrated in the laboratory. Finally, LEDs require lower voltages than fluorescent lamps, and hence, are better suited for applications in which the light source must be powered from a low-voltage source such as a battery or an internal computer DC power source.

Unfortunately, LEDs produce light in a relatively narrow spectral band. To replace conventional lighting systems, LED-based sources that generate light that appears to be "white" to a human observer are required. In addition to appearing white when viewed directly by user, the light source must also have a good color-rendering index so that the generated spectrum allows the user to view a colored object or scene and see the colors of the objects. The ability to accurately perceive the color of an illuminated scene is referred to as the color-rendering index of the light source. A light source with three narrow spectral bands at the red, green, and blue wavelengths looks white to a person viewing the light source, but has a very poor color-rendering index, since an object that reflects light at wavelengths between the spectral band will have a distorted color presentation. To provide a good color-rendering index, the light source must provide light at all wavelengths.

Phosphor conversion of light generated by an LED can be utilized to provide a white light source that has an adequate color-rendering index. A light source that appears to be white and that has a conversion efficiency comparable to that of fluorescent light sources can be constructed from a blue LED that is covered with a layer of phosphor that converts a portion of the blue light to a broad band of yellow light. Such light sources will be referred to as "phosphor-converted" light sources in the following discussion. If the ratio of blue to yellow light is chosen correctly, the resultant light source appears white to a human observer.

The color-rendering index of such yellow phosphor-converted light sources is significantly less than that provided by an incandescent bulb. In particular, the spectrum from this type of phosphor-converted light source has insufficient intensity in the red portion of the optical spectrum to provide a color rendering index that is as good as that provided by an incandescent bulb. As a result, in some applications, a red LED is added to the yellow-phosphor converted light source to improve the color-rendering index. In addition, the ratio of the red light to the blue light from the blue LED can be adjusted to provide a "warm" white light source in such two LED light sources.

The efficiency of a light source is defined to be the fraction of the electrical energy consumed by the light source that is converted to light in the region of the optical spectrum to which the human eye is sensitive. The overall efficiency of a phosphor-converted light source is determined by the efficiency with which the LED converts electricity to light and the efficiency with which the LED light is down-converted to light in the portion of the spectrum to which the eye is sensitive. When blue light is converted to light at longer wavelengths, the difference in energy between the blue photons and the longer wavelength photons is lost in the form of heat. For a blue to yellow conversion, the loss is a significant fraction of the energy. In addition, the yellow phosphors that are used in many applications also convert a significant fraction of the blue light to wavelengths that are greater than 630 nm. The sensitivity of the human eye to light in this region is small, and hence, this energy is, in effect, wasted.

SUMMARY OF THE INVENTION

The present invention includes a light source having first and second LEDs and a phosphor layer that converts light generated by the first LED. The first LED emits light at a first wavelength. The layer of phosphor is illuminated by the first LED, the phosphor being excited by light of the first wavelength to convert light of the first wavelength to a band of wavelengths having wavelengths between the first wavelength and a second wavelength. The second LED emits light at a third wavelength that is greater than the first wavelength. The phosphor is not substantially excited by light of the third wavelength. The combined light from the phosphor, and first and second LEDs is perceived as being white by a human observer.

DETAILED DESCRIPTION OF THE PREFERRED EMBODIMENTS OF THE INVENTION

Figure 1:
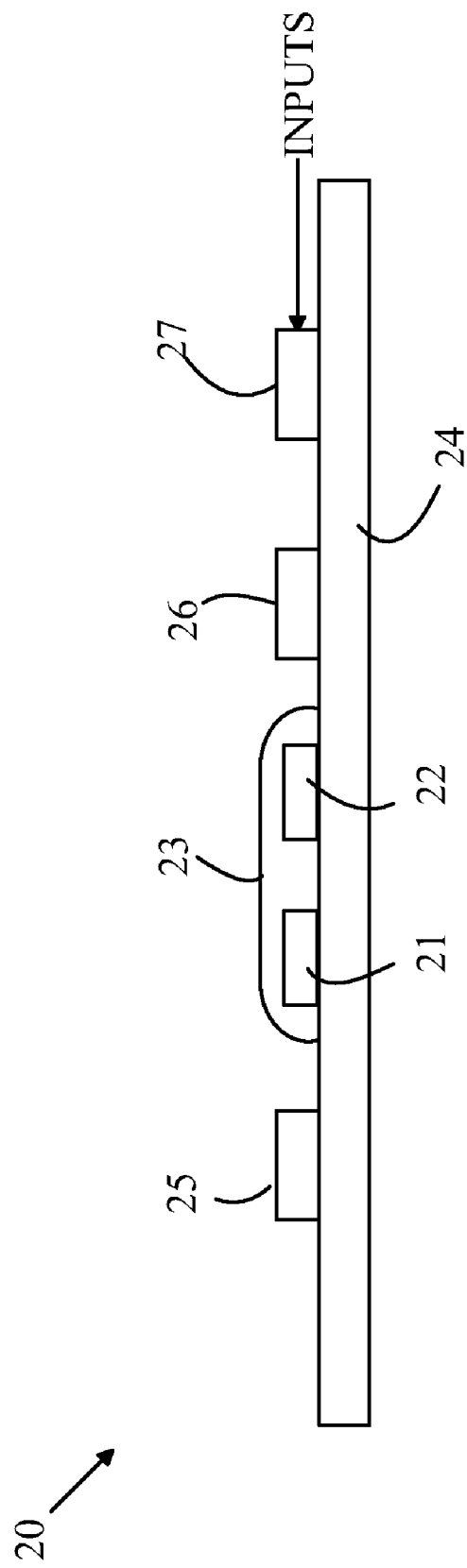
FIG. 1 is a cross-sectional view of a light source according to one embodiment of the present invention.

The manner in which the present invention provides its advantages can be more easily understood with reference to FIG. 1, which is a cross-sectional view of a light source according to one embodiment of the present invention. Light source 20 includes a blue LED 21 and a red LED 22 that are covered by a layer 23 of green phosphor. The LEDs are mounted on a substrate 24 that includes the contacts that power the LEDs and other conductors that connect the LEDs and the photodetectors described below to an optional controller 27. To simplify the drawing, the power traces and connections have been omitted from the drawing.

In this embodiment, the green phosphor is chosen to have a dominant wavelength of less than 555 nm. Since the green phosphor converts blue light to green light, which has a wavelength that is significantly less than that generated by the previously used yellow phosphor, the loss in energy associated with the down conversion is significantly less, and hence, the efficiency of the light conversion process is improved.

The red LED fills in the spectrum in the red region. Since the red LED emits at a wavelength that the green phosphor does not convert, the red portion of the spectrum is generated with an efficiency that is determined by the conversion efficiency of the red LED, as opposed to the conversion of blue light to red light in a phosphor layer. In this regard, it should be noted that the red LED can be covered with the same layer of phosphor as the blue LED, and hence, the fabrication of light source 20 is not significantly more complex than the fabrication of a conventional white LED that utilizes a layer of phosphor over a single LED.

Red LEDs having conversion efficiencies that are greater than the efficiency of conversion of a blue LED exciting a yellow phosphor are known to the art. Hence, the efficiency of generation of the light in the red portion of the spectrum is also improved. Furthermore, the yellow phosphors that are excited by blue LEDs in these light sources generate light at long wavelengths, i.e., infrared. Since the human eye has poor detection efficiency in this region of the optical spectrum, that light is wasted, and hence, the efficiency is reduced even further in a phosphor-converted light source.

In addition, long wavelength infrared emissions can be problematic in light sources that utilize some form of feedback loop to control the intensity of the light by measuring the light output and then adjusting the drive current to the LEDs. The photodetectors that are utilized in these schemes also detect the infrared light, and hence, the output of the photodetectors is not indicative of the light in the visible portion of the spectrum unless additional filters are incorporated to block the infrared light. Such filters increase the cost of the light sources.

In contrast, the red LEDs used in the present invention do not generate significant amounts of light at wavelengths that are outside of the human eye's receptive spectrum, and hence, energy is not wasted on regions of the spectrum in which the human eye has little sensitivity. In addition, the present invention does not introduce spurious infrared light that can interfere with feedback systems.

In the above-described embodiments, the red and blue LEDs are driven together, and hence, the light source provides light at a single color temperature. However, embodiments in which the red LED is driven separately from the blue LED can also be constructed. In this case, the color temperature can be tuned by altering the ratio of the currents supplied to the blue and red LEDs. A controller 27 is optionally included in light source 20 for this purpose. In addition, photodetectors 25 and/or 26 can be included to measure the light generated by light source 20. Since the phosphor layer scatters the light generated by the LEDs and the converted light is emitted in all directions, the photodetectors can provide a good estimate of the light being generated. In this regard, it should be noted that the photodetectors can include color filters such that photodetector 26 is more sensitive to light in the red region of the spectrum and photodetector 25 is more sensitive to light in the blue/green region of the spectrum such that the color temperature of the light source can be monitored and adjusted dynamically. Alternatively, a first control input to controller 27 can set the ratio of the drive currents to the LEDs to set the color temperature, and a second input can set the overall drive currents to set the intensity.

The above-described embodiments utilize a green phosphor and a red LED. However, other combinations of phosphors and LEDs could be utilized. In the more general case, the present invention utilizes a first LED that excites a phosphor such that light in the blue and green regions of the spectrum is generated by the first LED and the phosphor and a second LED that generates light having wavelengths that are longer than those generated by the phosphor. The phosphor is chosen such that light from the second LED is not converted by the phosphor. In addition, the combined light output has a spectrum that is perceived as being white by a human observer. For example, a green-yellow phosphor that is excited by a blue LED and an amber LED can provide a white light source with a color temperature between 2500° K and 7000° K.

In the above-described embodiments, the long wavelength emitting LED, i.e., the red or amber LED, and phosphor are chosen such that the light from the long wavelength emitting LED does not substantially excite the phosphor. For the purposes of this discussion, the long wavelength emitting LED will be defined as not substantially emitting a phosphor if less than 5 percent of the light from the long wavelength emitting LED is converted by the phosphor.

In the above-described embodiments, both the LED that excites the phosphor and the long wavelength emitting LED are covered by the phosphor layer. This arrangement provides a simpler fabrication scheme since a mechanism for preventing the phosphor layer from converting the long wavelength emitting LED is not required. In one aspect of the invention, the phosphor layer is constructed by suspending phosphor particles in a transparent carrier material such as an epoxy. The diameter of the phosphor particles is of the order, or greater than, the wavelength of the long wavelength light, and hence, the phosphor particles, while not converting the long wavelength light, will scatter the light. Similarly, the phosphor particles will scatter the short wavelength light that is not converted by the phosphor. As a result, the light source will appear to be a uniform source that is coincident with the phosphor layer.

Figure 2:
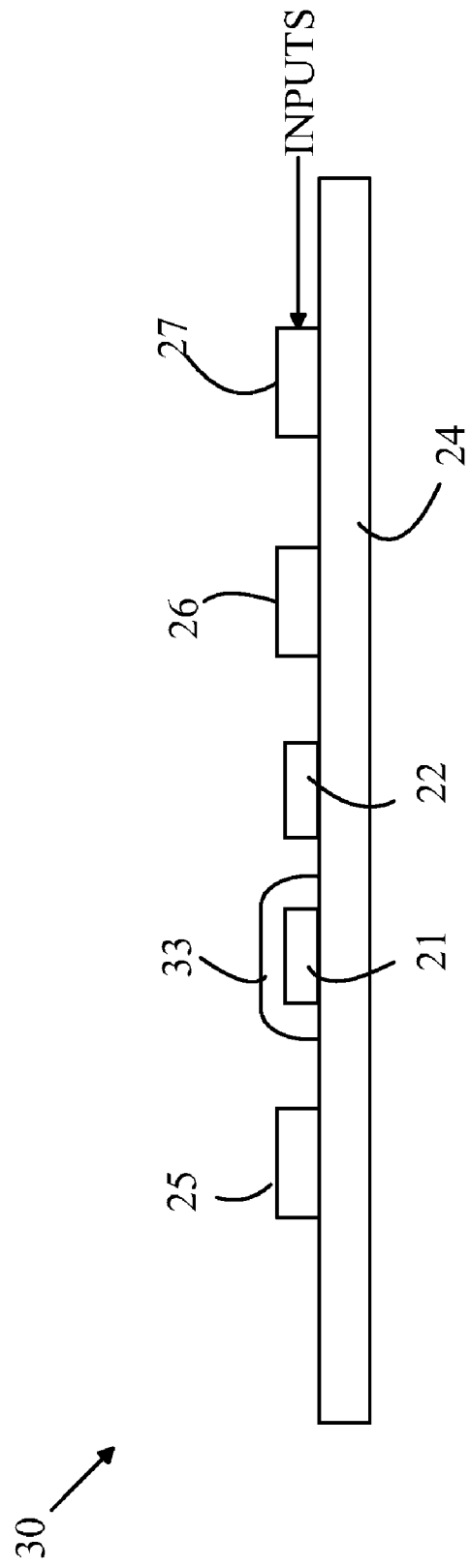
FIG. 2 illustrates an embodiment in which the long wavelength emitting LED is not covered by the phosphor layer.

However, embodiments in which the phosphor layer is limited to the short wavelength emitter can also be constructed. Refer now to FIG. 2, which illustrates an embodiment in which the long wavelength emitting LED is not covered by the phosphor layer. To simplify the discussion, those elements that perform functions analogous to elements shown in FIG. 1 have been given the same numeric designations and will not be discussed further. Light source 30 differs from light source 20 discussed above in that the phosphor layer 33 only covers the short wavelength emitting LED.

Figure 3:
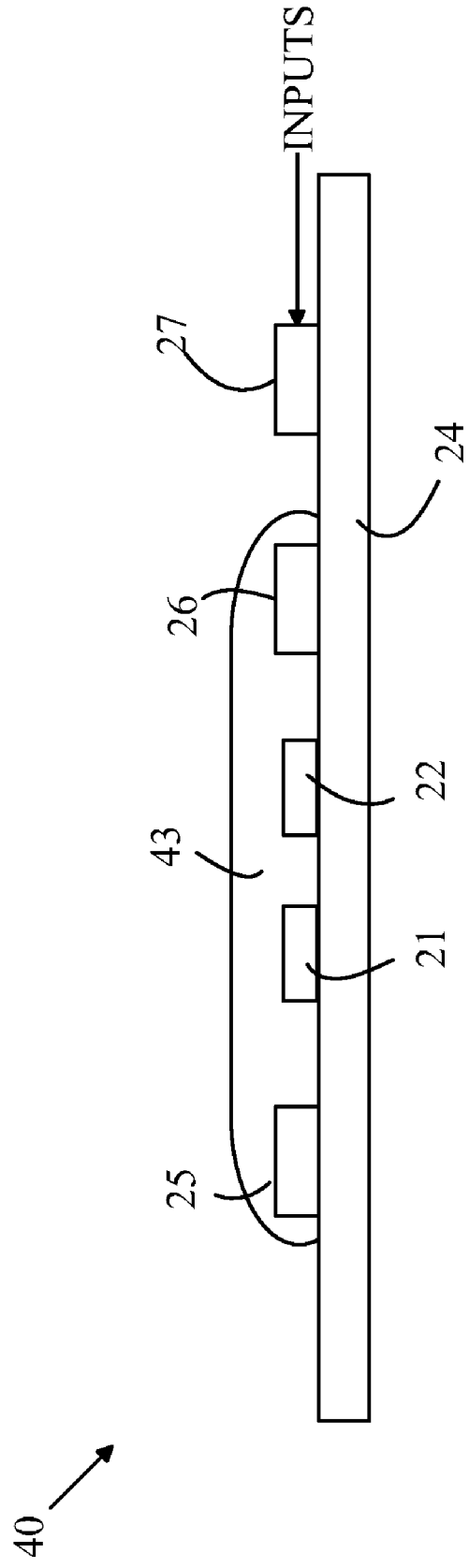
FIG. 3 illustrates another embodiment of a light source according to the present invention.

As noted above, embodiments that utilize detectors such as detectors 25 and 26 to monitor the output of the LEDs can be constructed. In one aspect of the present invention, the detectors in question are also covered by the phosphor layer. Refer now to FIG. 3, which illustrates a light source in which the detectors are also covered by the layer of phosphor. To simplify the discussion, those elements that perform functions analogous to elements shown in FIG. 1 have been given the same numeric designations and will not be discussed further. In light source 40, phosphor layer 43 also covers detectors 25 and 26. It should be noted that phosphor layer 43 includes phosphor particles that also scatter light from the LEDs that emit at the long wavelengths even though those particles do not convert the long wavelength light. Hence, detectors 25 and 26 sample the output light from light source 40 when the detectors are within the phosphor layer.

The above-described embodiments utilize an arrangement in which the phosphor layer covers the short wavelength LED, and optionally, the long wavelength LED. In one aspect of the invention, the layer of phosphor is generated by suspending particles of the phosphor in question in a transparent medium such as epoxy and then dispensing the transparent medium over the LED. The epoxy is then cured to provide the final layer.

Figure 4:
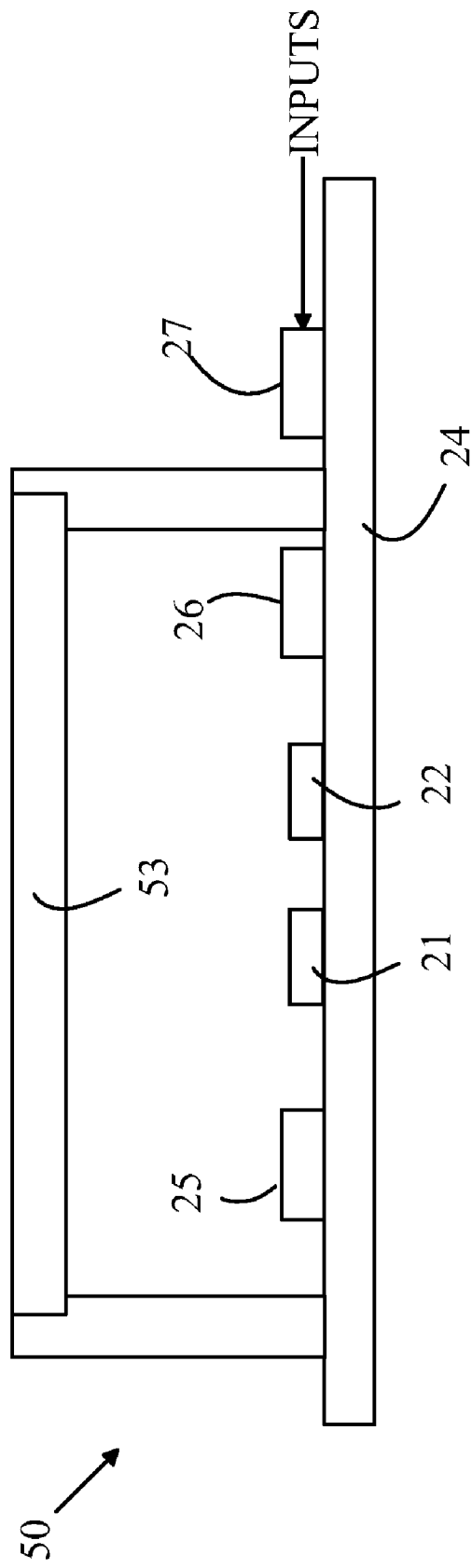
FIG. 4 illustrates another embodiment of a light source according to the present invention.

However, embodiment in which the phosphor layer is remote from the LEDs can also be constructed. In one aspect of the present invention, the phosphor layer is preformed by molding a rigid layer of transparent material in which the phosphor particles are suspended and then mounting that layer over the LEDs. Refer now to FIG. 4, which illustrates another embodiment of a light source according to the present invention. Light source 50 differs from light source 40 discussed above in that phosphor conversion layer 53 is separated from LEDs 21 and 22. This arrangement provides improved heat dissipation both for LEDs 21 and 22 and for phosphor layer 53.

The above-described embodiments have utilized two LEDs, a short wavelength emitting LED that excites the phosphor and a long wavelength emitting LED that fills in the long wavelength region of the visible spectrum to provide a light source that is perceived as being white by a human observer and has a good color rendering index. However, it is to be understood that each of the LEDs discussed above could be replaced by a plurality of LEDs to provide additional power.

Blue-emitting LEDs suitable for the present invention can be constructed in GaN system of materials. LEDs that emit at a dominant wavelength between 430 and 470 nm are well adapted for use in the present invention. Amber LEDs that have dominant emission in the range of 595 nm to about 620 nm or red LEDs that have dominant emissions in the 660 nm to 700 nm range can be utilized for the long wavelength LEDs.

Green phosphors particles constructed from europium-doped scandates, europium-doped silicates, europium-doped silicon oxynitrides and sulfoselenide can be utilized for the light conversion phosphors in the present invention. In addition, green phosphors constructed from quantum dot in the InP system of materials could also be utilized.

In addition, phosphor layers constructed from quantum dot phosphors or a combination of conventional and quantum dot phosphors could be utilized. "Quantum dot" phosphors are phosphors whose emission spectra depends on the size of the particles, and hence, can be used to convert light to a predetermined wavelength by utilizing the appropriate sized particles. Quantum dots are semiconductor nanometer sized crystals. As the size of the particles decrease, the particles reach a size at which the band gap of the material becomes dependent on the particle size. As a result, the emission spectrum is shifted to smaller wavelengths as the particle size is decreased. Quantum dot phosphors based on particles of InP could be utilized in the present invention. The emission wavelength depends on the particle size, and hence, a phosphor having the desired emission wavelength can be constructed by controlling the particle size.

However, quantum dot phosphors emit in a very narrow band of wavelengths, and hence, a phosphor layer constructed from a number of different quantum dot phosphors that emit at slightly different wavelengths is advantageous for light sources that require a good color rendering index.

The above-described embodiments utilize a photodetector comprising two photodiodes to measure the light output associated with each of the LEDs. However, any form of photodetector that can provide a measurement of the relative light outputs of the LEDs or of the spectrum of the light generated by the light source could be utilized.

The above-described Summary of the Invention and embodiments of the present invention have been provided to illustrate various aspects of the invention. However, it is to be understood that different aspects of the present invention that are shown in different specific embodiments can be combined to provide other embodiments of the present invention. In addition, various modifications to the present invention will become apparent from the foregoing description and accompanying drawings. Accordingly, the present invention is to be limited solely by the scope of the following claims.

What is claimed is:

1. A light source comprising:
   a first LED that emits light at a first wavelength;
   a layer of phosphor that is illuminated by said first LED, said phosphor being excited by light of said first wavelength to convert light of said first wavelength to a band of wavelengths having wavelengths greater than said first wavelength and having a dominant wavelength less than 555 nm; and
   a second LED that emits light at a third wavelength that is greater than said first wavelength,
   wherein said phosphor is not substantially excited by light of said third wavelength, and wherein said combined light from said phosphor, and first and second LEDs is perceived as being white by a human observer; and
   wherein said second LED has a higher efficiency for converting electrical energy into light at said third wavelength than the efficiency characterizing the combination of said first LED and said phosphor for converting electrical energy into light at said third wavelength.

2. The light source of claim 1 wherein said layer of phosphor overlies both said first and second LEDs.

3. The light source of claim 2 wherein said layer of phosphor is in contact with both said first and second LEDs.

4. The light source of claim 2 wherein said layer of phosphor is not in contact with either of said first and second LEDs.

5. The light source of claim 1 further comprising a controller that powers said first and second LEDs.

6. The light source of claim 5 wherein said controller adjusts the relative intensities of light generated by said first and second LEDs in response to a control signal that is input to said controller.

7. A light source comprising:
   a first LED that emits light at a first wavelength;
   a layer of phosphor that is illuminated by said first LED, said phosphor being excited by light of said first wavelength to convert light of said first wavelength to a band of wavelengths having wavelengths greater than said first wavelength;
   a second LED that emits light at a third wavelength that is greater than said first wavelength,
   wherein said phosphor is not substantially excited by light of said third wavelength, and wherein said combined light from said phosphor, and first and second LEDs is perceived as being white by a human observer; and
   wherein said light source; and
   a first photodetector that detects light leaving said layer of phosphor;
   wherein said first photodetector is covered by said layer of phosphor.

8. The light source of claim 7 further comprising a second photodetector that detects light leaving said layer of phosphor, said second photodetector having a different spectral sensitivity than said first photodetector.

9. The light source of claim 1 wherein said first LED emits light at a dominant wavelength between 430 nm and 470 nm and wherein said second LED emits light at a dominant wavelength between 595 nm and 700 nm.

10. The light source of claim 9 wherein said layer of phosphor comprises a phosphor chosen from the group consisting of europium-doped scandates, europium-doped silicates, europium-doped silicon oxynitrides, sulfoselenide, and quantum dot phosphors.

11. The light source of claim 3 further comprising a photodetector that measures an intensity of light generated by said first LED, said photodetector being covered by said layer of phosphor.

12. The light source of claim 11 wherein said photodetector also measures an intensity of light generated by said second LED.

13. The light source of claim 12 further comprising a controller that controls said first and second LEDs such that said light source generates light that is perceived by human observer to have a predetermined optical spectrum, said controller utilizing said measurements from said photodetector.

14. A method for generating light comprising:
providing a first LED that emits light at a first wavelength;
providing a layer of phosphor that is illuminated by said first LED, said phosphor being excited by light of said first wavelength to convert light of said first wavelength to a band of wavelengths having wavelengths greater than said first wavelength and having a dominant wavelength less than 555 nm; and
providing a second LED that emits light at a third wavelength that is greater than said first wavelength,
wherein said phosphor is not excited by light of said third wavelength, and wherein said combined light from said phosphor, and first and second LEDs is perceived as being white by a human observer, and wherein said second LED has a higher efficiency for converting electrical energy into light at said third wavelength than the efficiency characterizing the combination of said first LED and said phosphor for converting electrical energy into light at said third wavelength.

15. The method of claim 14 wherein providing said layer of phosphor comprises covering said first LED with a layer of transparent material containing particles of said phosphor suspended therein.

16. The method of claim 14 wherein providing said layer of phosphor comprises pre-forming a rigid layer of transparent material with phosphor particles suspended therein and mounting said preformed layer over said LEDs.

* * * * *